US008856631B2

(12) United States Patent
Yang et al.

(10) Patent No.: US 8,856,631 B2
(45) Date of Patent: Oct. 7, 2014

(54) SYSTEMS AND METHODS FOR PARALLEL RETRY PROCESSING DURING ITERATIVE DATA PROCESSING

(71) Applicant: LSI Corporation, Milpitas, CA (US)

(72) Inventors: Shaohua Yang, San Jose, CA (US); Fan Zhang, Milpitas, CA (US); Jun Xiao, Fremont, CA (US)

(73) Assignee: LSI Corporation, San Jose, CA (US)

( * ) Notice: Subject to any disclaimer, the term of this patent is extended or adjusted under 35 U.S.C. 154(b) by 57 days.

(21) Appl. No.: 13/644,542

(22) Filed: Oct. 4, 2012

(65) Prior Publication Data

US 2014/0101509 A1     Apr. 10, 2014

(51) Int. Cl.
*H03M 13/41*     (2006.01)

(52) U.S. Cl.
USPC ............................ 714/795; 714/773; 714/724

(58) Field of Classification Search
CPC .......................... H03M 13/41; H03M 13/4107
USPC .................. 714/795, 704, 773, 764, 758, 724
See application file for complete search history.

(56) References Cited

U.S. PATENT DOCUMENTS

| 5,701,314 | A | 12/1997 | Armstrong | |
|---|---|---|---|---|
| 5,712,861 | A | 1/1998 | Inoue | |
| 6,438,717 | B1 | 8/2002 | Butler | |
| 6,657,803 | B1 | 12/2003 | Ling | |
| 7,136,244 | B1 | 11/2006 | Rothberg | |
| 7,685,467 | B2 * | 3/2010 | Mandal et al. | 714/29 |
| 7,702,989 | B2 | 4/2010 | Graef | |
| 7,730,384 | B2 | 6/2010 | Graef | |
| 7,738,201 | B2 | 6/2010 | Jin | |
| 7,971,125 | B2 | 6/2011 | Graef | |
| 7,990,642 | B2 | 8/2011 | Lee | |
| 8,041,998 | B2 * | 10/2011 | Mandal et al. | 714/27 |
| 8,176,404 | B2 | 5/2012 | Yang | |
| 2011/0080211 | A1 | 4/2011 | Yang | |
| 2011/0161633 | A1 | 6/2011 | Xu | |
| 2012/0200954 | A1 | 8/2012 | Jin | |
| 2012/0236429 | A1 | 9/2012 | Yang | |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/602,440, filed Sep. 4, 2012, Fan Zhang, Unpublished.
U.S. Appl. No. 13/560,737, filed Jul. 27, 2012, Weijun Tan, Unpublished.
U.S. Appl. No. 13/474,672, filed May 17, 2012, Fan Zhang, Unpublished.
U.S. Appl. No. 13/459,282, filed Apr. 30, 2012, Fan Zhang, Unpublished.
U.S. Appl. No. 13/490,849, filed Jun. 7, 2012, Johnson Yen, Unpublished.
U.S. Appl. No. 13/445,858, filed Apr. 12, 2012, Johnson Yen, Unpublished.
U.S. Appl. No. 13/412,492, filed Mar. 5, 2012, Shaohua Yang, Unpublished.

(Continued)

*Primary Examiner* — Fritz Alphonse
(74) *Attorney, Agent, or Firm* — Hamilton DeSanctis & Cha

(57) ABSTRACT

Systems, circuits, devices and/or methods related to systems and methods for data processing, and more particularly to systems and methods for priority based data processing.

20 Claims, 4 Drawing Sheets

(56) References Cited

OTHER PUBLICATIONS

U.S. Appl. No. 13/483,982, filed May 30, 2012, Yang Han, Unpublished.
U.S. Appl. No. 13/326,367, filed Dec. 15, 2011, Shaohua Yang, Unpublished.
U.S. Appl. No. 13/372,600, filed Feb. 14, 2012, Shaohua Yang, Unpublished.
U.S. Appl. No. 13/326,363, filed Dec. 15, 2011, Fan Zhang, Unpublished.
U.S. Appl. No. 13/465,214, filed May 7, 2012, Chung-Li Wang, Unpublished.

* cited by examiner

SYSTEMS AND METHODS FOR PARALLEL RETRY PROCESSING DURING ITERATIVE DATA PROCESSING

BACKGROUND

Some embodiments of the present inventions are related to systems and methods for data processing, and more particularly to systems and methods for priority based data processing.

Various data transfer systems have been developed including storage systems, cellular telephone systems, and radio transmission systems. In each of the systems, data is transferred from a sender to a receiver via some medium. For example, in a storage system, data is sent from a sender (i.e., a write function) to a receiver (i.e., a read function) via a storage medium. In some cases, the data processing function uses a variable number of iterations through a data detector circuit and/or data decoder circuit depending upon the characteristics of the data being processed. Where a data set fails to converge, the read of a number of data sets surrounding the failing data set may be considered to have failed, or the latency for processing a data set may be significantly increased.

Hence, for at least the aforementioned reasons, there exists a need in the art for advanced systems and methods for data processing.

BRIEF SUMMARY

Some embodiments of the present inventions are related to systems and methods for data processing, and more particularly to systems and methods for priority based data processing.

Various embodiments of the present invention provide data processing systems that include: a data detector circuit, a data decoder circuit, an input buffer, and a scheduling circuit. The data detector circuit is operable to apply a data detection algorithm to a detector input to yield a detected output. The data decoder circuit is operable to apply a data decode algorithm to a decoder input derived from the detected output to yield a decoded output. The input buffer is operable to maintain at least a first data set and a second data set. The first data set completed a defined amount of processing by the data detector circuit and the decoder circuit without converging, and the second data set is yet to complete the defined amount of processing by the data detector circuit and the decoder circuit. The scheduling circuit is operable to schedule processing of the first data set by one of the data detector circuit and the data decoder circuit in parallel with processing of the second data set by one of the data detector circuit and the data decoder circuit.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
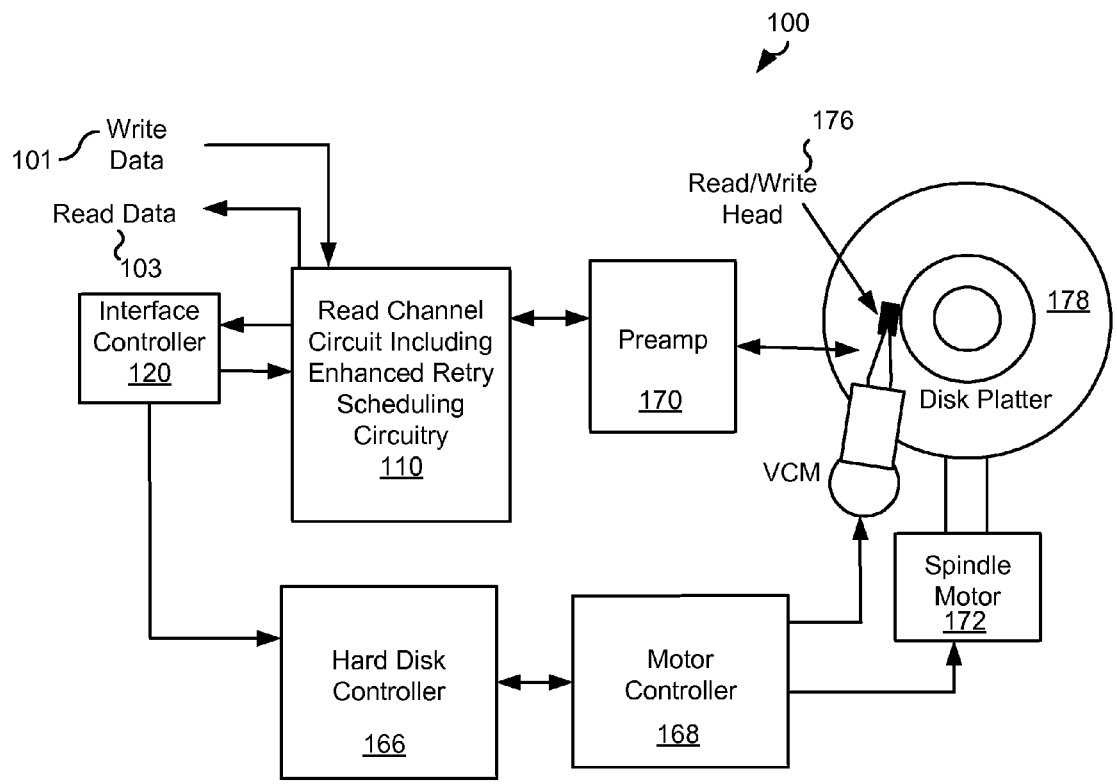
FIG. 1 shows a storage system including parallel retry processing circuitry in accordance with various embodiments of the present invention.

Some embodiments of the present inventions are related to systems and methods for data processing, and more particularly to systems and methods for priority based data processing.

Various embodiments of the present invention provide data processing systems that employ on-the-fly retry processing and out of order processing. The out of order processing operates by processing higher quality data sets before lower quality data sets. Higher quality data sets are expected to converge more quickly than lower quality data sets, and by allowing the higher quality data sets to be processed before lower quality data sets regardless of the order in which they are received lowers the average latency for a data set between introduction to the data processing circuit and reporting at the output of the data processing circuit.

The data processing systems include a data detector circuit and a data decoding circuit. Processing through both the data detector circuit and the data decoding circuit is considered a "global iteration". The data decoding circuit may repeatedly apply a data decoding algorithm to a processing data set during a given global iterations. Each application of the data decoding algorithm during a given global iteration is referred to as a "local iteration". As used herein, "standard processing" of a data set is done within a defined number of global and/or local iterations. Additional processing of a data set that failed to converge during standard processing is referred to herein as "retry processing". A data set progressing during standard processing is considered herein as a "normal data set". A normal data set is re-classified as a "retry data set" where it completes standard processing without convergence and awaits or is progressing during retry processing.

In addition the aforementioned out of order processing, retry processing of one or more retry data sets is allowed to continue in parallel to standard processing of one or more normal data sets. Allowing parallel retry processing operates to complete processing of one or more retry data sets maintained in an input buffer which increases the processing capability of the data processing systems.

Various embodiments of the present invention provide data processing systems that include: a data detector circuit, a data decoder circuit, an input buffer, and a scheduling circuit. The data detector circuit is operable to apply a data detection algorithm to a detector input to yield a detected output. The data decoder circuit is operable to apply a data decode algorithm to a decoder input derived from the detected output to yield a decoded output. The input buffer is operable to maintain at least a first data set and a second data set. The first data set completed a defined amount of processing by the data detector circuit and the decoder circuit without converging, and the second data set is yet to complete the defined amount of processing by the data detector circuit and the decoder circuit. The scheduling circuit is operable to schedule processing of the first data set by one of the data detector circuit and the data decoder circuit in parallel with processing of the second data set by one of the data detector circuit and the data decoder circuit.

In some instances of the aforementioned embodiments, the input buffer is further operable to store a third data set yet to complete the defined amount of processing by the data detector circuit and the decoder circuit. In such instances, the scheduling circuit is further operable to select between the second data set and the third data set for introduction to the data detector circuit as the detector input based at least in part on a priority scheme. In some cases, the the priority scheme allows for selecting one of the second data set or the third data set out of order from when it was originally stored in the input buffer. In various cases, the data processing system further includes a quality metric determination circuit operable to determine a first quality metric based upon the second data set and to determine a second quality metric based upon the third data set. In one particular case, the first quality metric is based upon a result selected from one of an output from a detection process, or the decoded output. In another particular case, the priority scheme is based at least in part on comparison of a first quality metric associated with the second data set and a second quality metric associated with the third data set. In various cases, the priority scheme allows for introduction of the first data set as the detector input only after selection of the second data set and the third data set.

Other embodiments of the present invention provide methods for data processing that include: providing a data processing circuit including: a data detector circuit operable to apply a data detection algorithm to a detector input to yield a detected output, and a data decoder circuit operable to apply a data decode algorithm to a decoder input derived from the detected output to yield a decoded output. In addition, the methods include storing a first data set and a second data set to an input buffer. The first data set completed a defined amount of processing by the data detector circuit and the decoder circuit without converging, and the second data set is yet to complete the defined amount of processing by the data detector circuit and the decoder circuit. The methods further include scheduling processing of the first data set by one of the data detector circuit and the data decoder circuit in parallel with processing of the second data set by one of the data detector circuit and the data decoder circuit.

In some instances of the aforementioned embodiments, the methods further include: storing a third data set that is yet to complete the defined amount of processing by the data detector circuit and the decoder circuit to the input buffer; and selecting one of the second data set and the third data set for introduction to the data detector circuit as the detector input based at least in part on a priority scheme. In some cases, the priority scheme allows for selecting one of the second data set or the third data set out of order from when it was originally stored in the input buffer. In one or more cases, the methods further include determining a first quality metric based upon the second data set and to determine a second quality metric based upon the third data set. In one or more cases the first quality metric is based upon one of an output from a detection process, or the decoded output. In some cases, the priority scheme is based at least in part on comparison of a first quality metric associated with the second data set and a second quality metric associated with the third data set.

Turning to FIG. 1, a storage system 100 including a read channel circuit 110 having parallel retry processing circuitry in accordance with various embodiments of the present invention is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a combination of out of order processing and on-the-fly retry processing. In particular, where a given data set fails to converge after standard processing by read channel circuit 110, it does not stop the reporting of other converging data sets as the data sets may be reported to a requesting device. This limits the impact of a failed data set on the latency of a converged data set. Further, higher quality data sets may be selected for processing prior to lower quality data sets regardless of the order in which the data sets are received. This further decreases average latency through the data processing system. In addition, a data set that fails to converge may be re-processed using retry processing in parallel with other data sets being processed using standard processing. This allows for increased throughput by addressing non-converging data sets using space in an input buffer without delaying until, for example, a track change condition. In some cases, read channel circuit 110 may be implemented to include a data processing circuit similar to that discussed below in relation to FIG. 3. Further, the processing may be accomplished consistent with one of the approaches discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
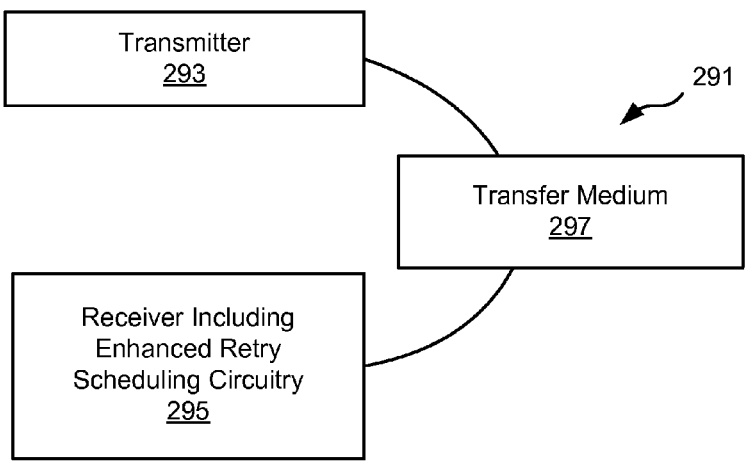
FIG. 2 depicts a data transmission system including parallel retry processing circuitry in accordance with one or more embodiments of the present invention.

Turning to FIG. 2, a data transmission system 291 including a receiver 295 having parallel retry processing circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. As part of processing the received information, receiver 295 utilizes a combination of out of order processing and on-the-fly retry processing. In particular, where a given data set fails to converge after normal processing by receiver 295, it does not stop the reporting of other converging data sets as the data sets may be reported to a requesting device. This limits the impact of a failed data set on the latency of a converged data set. Further, higher quality data sets may be selected for processing prior to lower quality data sets regardless of the order in which the data sets are received. This further decreases average latency through the data processing system. In addition, a data set that fails to converge may be re-processed using enhanced processing techniques in parallel with other data sets being processed using standard processing. This allows for increased throughput by addressing non-converging data sets using space in an input buffer without delaying until, for example, a track change condition. In some cases, receiver 295 may be implemented to include a data processing circuit similar to that discussed below in relation to FIG. 3. Further, the processing may be accomplished consistent with one of the approaches discussed below in relation to FIGS. 4a-4b.

Figure 3:
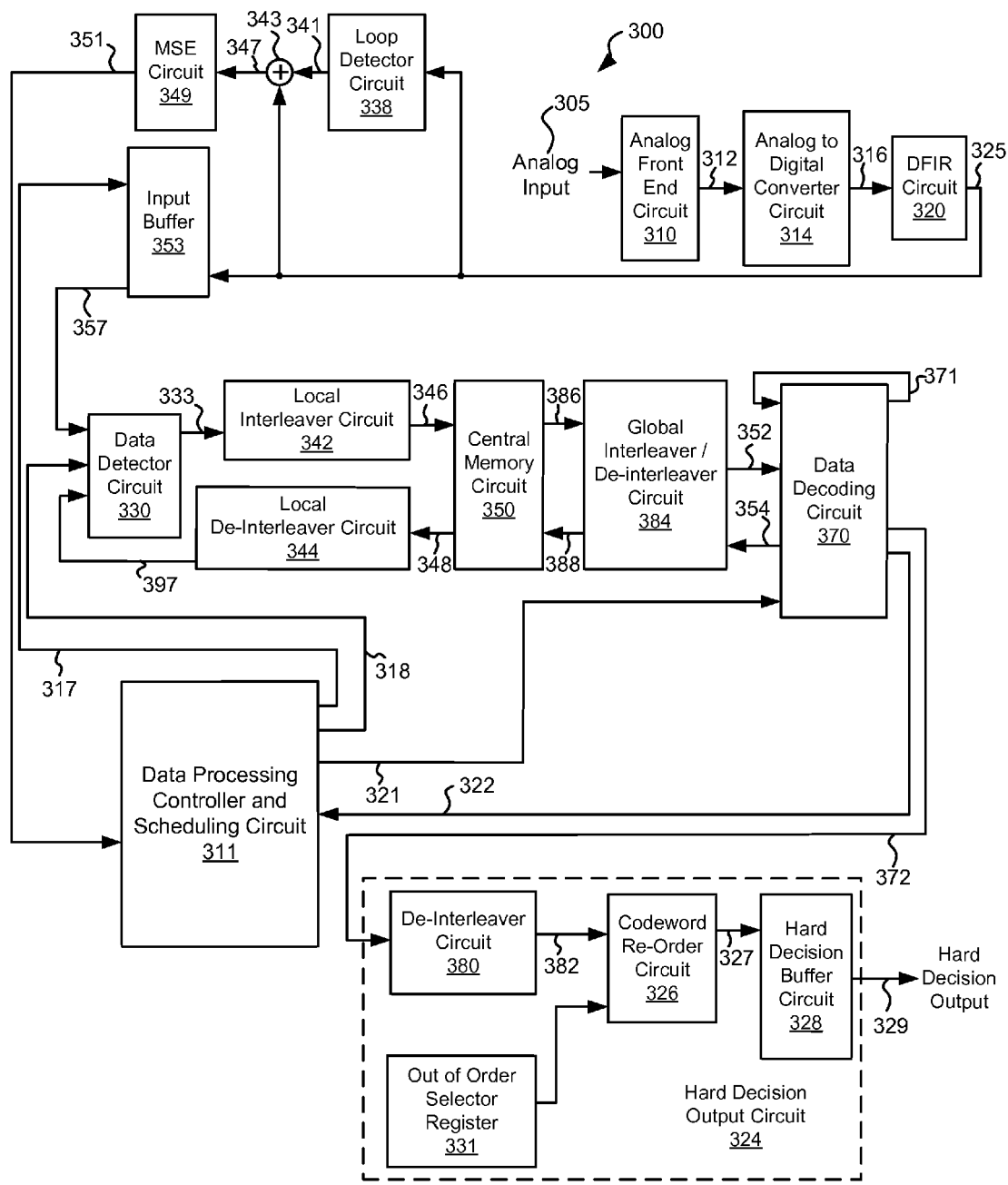
FIG. 3 shows a data processing circuit including parallel retry processing circuitry in accordance with some embodiments of the present invention.

FIG. 3 shows a data processing circuit 300 including parallel retry processing circuitry in accordance with one or more embodiments of the present invention. Data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input. Equalized output 325 is stored to an input buffer 353 that includes sufficient memory to maintain a number of codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). An output 357 is provided to data detector circuit 330.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/de-interleaver circuit 384 may be any circuit known in the art that is capable of globally rearranging codewords. Global interleaver/De-interleaver circuit 384 provides a decoder input 352 into data decoding circuit 370. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371. This continues until either a maximum number of local iterations is exceeded or decoded output 371 converges (i.e., completion of standard processing).

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 where it is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 is accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output converges (i.e., yields the originally written data set), the resulting decoded output is provided as an output codeword 372 to a hard decision output circuit 324. Hard decision output circuit 324 includes a de-interleaver circuit 380 that rearranges the data to reverse both the global and local interleaving applied to the data to yield a de-interleaved output 382. De-interleaved output 382 is provided to a codeword re-order circuit 326 that arranges the received codeword along with other previously received codewords in an order expected by a requesting host processor. In some cases, for example, thirty-two codewords may be requested by a host in one request. Codeword re-order circuit 326 assembles the requested thirty-two codewords in a desired order and provides the ordered codewords as a codeword block 327. Codeword block 327 is not provided until all of the requested thirty-two codewords are available where an out of order control is de-asserted by an out of order selector register 331. Out of order selector register 331 is programmable to control whether out of order reporting is allowed or not. A hard decision buffer circuit 328 buffers the codeword block 327 as it is transferred to the requesting host as a hard decision output 329. Alternatively, where the out of order control is asserted by out of order selector register 331 codeword-reorder circuit 326 reports the codewords as the are received via hard decision buffer circuit 328. Allowing data to be reported out of order avoids increases in latency for a converging codeword due to the failure of other codewords to converge.

Where decoded output 371 fails to converge (i.e., fails to yield the originally written data set), a number of local iterations through data decoder circuit 370 exceeds a threshold, and no more global iterations are allowed during standard processing of the corresponding data set maintained in input buffer 353, the data set is identified as a "retry data set" and on-the-fly retry processing is performed. Such on-the-fly retry processing is retry processing of a retry data set may be performed in parallel with standard processing of a normal data set. This assumes that the standard processing is not being terminated due to an overflow of input buffer 353. Where decoded output 371 fails before terminating standard processing due to an overflow of input buffer 353 the currently processing data set is not maintained in input buffer 353 for additional on-the-fly retry processing.

To differentiate between retry data sets which have completed standard processing without completing, data sets in input buffer 353 that have not yet completed their allotment of global and local iterations are referred to as "normal data sets". Additional retry processing of a retry data set is enabled by a data processing controller and scheduling circuit 311. In particular, data processing controller and scheduling circuit 311 indicates that the equalized output 325 that corresponds to the codeword that failed to converge during its last local iteration through data decoding circuit 370 be maintained in input buffer 353 by asserting a control signal 317. When control signal 317 is asserted, equalized output 325 in input buffer 353 that corresponds to the recently completed data set from data decoding circuit 370 that failed to converge is identified as a retry data set.

In addition, data processing controller and scheduling circuit 311 controls scheduling of the various equalized outputs 325 in input buffer 353 that are processed through data detector circuit 330. In particular, where there is no decoder output 348 available for use in guiding a second or later global iteration of either a normal data set or a retry data set in input buffer 353, data processing controller and scheduling circuit 311 asserts a set selector control 318 such that the best equalized output 325 that has not yet been processed through a first global iteration is selected for processing by data detector circuit 330.

The best equalized output 325 is selected based upon a detect quality metric 351 of equalized output 325. Equalized output 325 is provided to a loop detector circuit 338 that applies a data detection algorithm to equalized output 325 to yield a detected output 341. In some embodiments of the present invention, loop detector circuit 338 is a simplified version of data detector circuit 330 that is operable to provide detected output 341 as a rough approximation of what detected output 333 will be when data detector circuit 330 applies the data detection algorithm to the same equalized output 325 pulled from input buffer 353. Based upon the disclosure provided herein, one of ordinary skill in the art will recognize a variety of data detector circuits that may be used in relation to different embodiments of the present invention. Detected output 341 is provided to a summation circuit 343 that is operable to subtract equalized output 325 from corresponding instances of detected output 341 to yield a series of error values 347.

Error values 347 are provided to a mean squared error (MSE) calculation circuit 349 that calculates a mean squared error across each codeword received as equalized output 325. The mean squared error value is provided as detect quality metric 351 to data processing controller and scheduling circuit 311. In such a case, a higher value of detect quality metric 351 indicates a lower quality. The mean squared error value is calculated in accordance with mean squared error calculations as are known in the art. Alternatively, another error calculation may be used such as, for example, an average error value across the entire codeword. Based upon the disclosure provided herein, one of ordinary skill in the art will recognize a variety of error calculations that may be used in relation to different embodiments of the present invention.

Alternatively, where there are one or more instances of decoder output 348 available for use in guiding a second or later global iteration of a normal data set in input buffer 353, data processing controller and scheduling circuit 311 asserts set selector control 318 such that the best instance of decoder output 348 is selected for a subsequent global iteration. The best instance of decoded output 348 is selected based upon a decode quality metric 322. Decode quality metric may be calculated as the number of remaining unsatisfied checks (i.e., the number of parity equations that could not be satisfied by the decoding algorithm) or errors in the codeword are reported at the end of decoding the data set corresponding to the particular instance of decoder output 348 by data decoding circuit 370. Based upon the disclosure provided herein, one of ordinary skill in the art will recognize a variety of decode quality metrics that may be used to identify the best instance of decoder output 348 in accordance with different embodiments of the present invention.

As another alternative, where there are not any normal data sets ready for processing in input buffer 353 (neither new normal data sets, or instance of decoder output 348 corresponding to an old normal data set) and there is a free slot in central memory circuit 350 to receive a new detected output 333, data processing controller and scheduling circuit 311 asserts set selector control 318 to select any available retry data set available in input buffer 353 for processing by data detector circuit 330. Where, on the other hand, there is either not a retry data set available in input buffer 353 or there is not an available slot in central memory circuit 350, data processing controller and scheduling circuit 311 asserts set selector control 318 such that no input is selected for data detector circuit 330 and data detector circuit 330 remains idle.

It should be noted that one or more embodiments of the present invention may use central memory circuit 350 to hold data to be processed using retry processing, and/or may use modified quality based priority selection as discussed in U.S. patent application Ser. No. 13/907,226 and filed on a date even herewith by Yang et al. The entirety of the aforementioned reference is incorporated herein by reference for all purposes.

Yet further, data processing controller and scheduling circuit 311 controls scheduling of the various instances of interleaved codewords 346 maintained in central memory circuit 350 for processing by data decoding circuit 370. In particular, where there is at least one instance of interleaved codewords 346 in central memory circuit 350 that await processing by data decoder circuit 370, data processing controller and modified priority based scheduling circuit 311 selects the best instance for processing by data decoding circuit 370 by asserting a schedule control 321. The best instance for processing is selected similar to selecting the best instance for processing by data detector circuit 330. In particular, for the first global iteration of a particular instance of interleaved codeword 346, the quality used to determine the status as best is based upon detect quality metric 351, while the status as best for the second and later global iterations of a particular instance of interleaved codeword 346 is based upon decode quality metric 322. Alternatively, if there are not any instances of interleaved codewords 346 in central memory circuit 350, then data decoding circuit 370 remains idle.

Figure 4A:
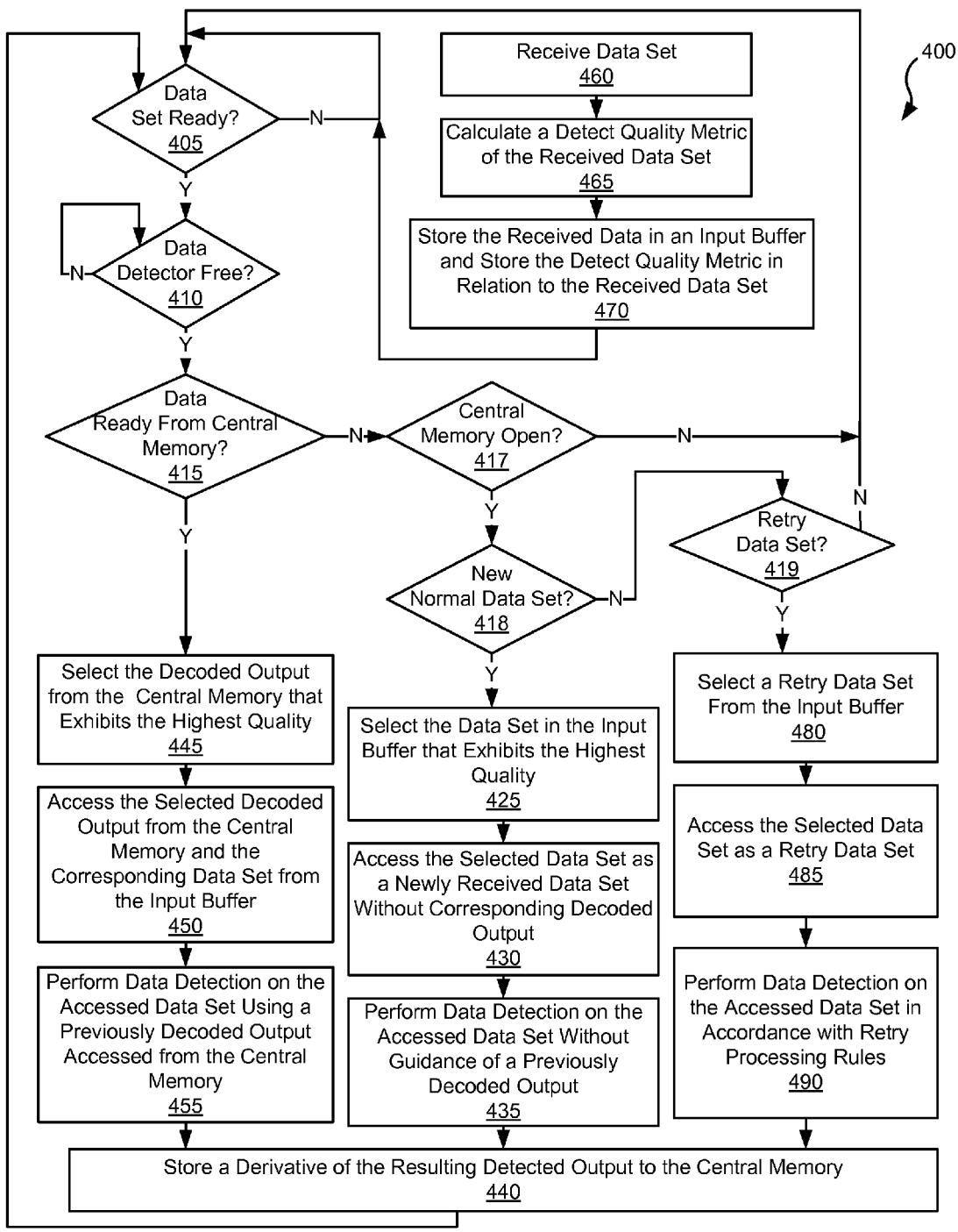
FIGS. 4a-4b are flow diagrams showing a method for parallel retry processing in accordance with some embodiments of the present invention.

FIG. 4a is a flow diagram 400 showing a method for parallel retry processing in accordance with some embodiments of the present invention. Following flow diagram 400 a data set is received (block 460). This data set may be derived or received from, for example, a storage medium or a communication medium. As the data set is received, a detect quality metric is calculated for the data set (block 465). This calculation may include, for example, applying a data detection algorithm or processed to the data set to yield a detected output, and subtracting the detected output from corresponding instances of the received data set to yield an error. The resulting series of errors are then used to calculate a mean squared error value across a number of instances corresponding to a codeword. The mean squared error value is the detect quality metric. Based upon the disclosure provided herein, one of ordinary skill in the art will recognize other priority metrics that may be used in relation to different embodiments of the present invention. The received data set is stored in an input buffer and the detect quality metric is stored in relation to the received data set (block 470).

It is repeatedly determined whether a data set is ready for processing (block 405). A data set may become ready for processing where either the data set was previously processed and a data decode has completed in relation to the data set and the respective decoded output is available in a central memory, or where a previously unprocessed data set becomes available in the input buffer. Where a data set is ready (block 405), it is determined whether a data detector circuit is available to process the data set (block 410).

Where the data detector circuit is available for processing (block 410), it is determined whether there is a decoded output in the central memory that is ready for additional processing (block 415). Where there is a decoded output available in the central memory (block 415), the available decoded output in the central memory that exhibits the highest quality is selected (block 445). The highest quality is the decoded output that corresponds to a decode quality metric (see block 441) with the lowest value. In some cases, only one decoded output is available in the central memory. In such cases, the only available decoded output is selected. The data set corresponding to the selected decoded output is accessed from the input buffer and the selected decoded output is accessed from the central memory (block 450), and a data detection algorithm is applied to the data set (i.e., the second or later global iteration of the data set) using the accessed decoded output as guidance (block 455). Application of the data detection algorithm yields a detected output. A derivative of the detected output is stored to the central memory (block 440). The derivative of the detected output may be, for example, an interleaved or shuffled version of the detected output.

Alternatively, where there is not a decoded output in the central memory (block 415), it is determined whether there is sufficient room in the central memory to receive a detected output (block 417). Where there is not sufficient room in the central memory (block 417), the processing returns to block 405 and the data detector circuit is idled. Alternatively, where there is sufficient room in the central memory (block 417), it is determined whether there is a new normal data set awaiting processing in the input buffer (block 418), or a retry data set awaiting processing in the input buffer (block 419). Where there is a new normal data set available (block 418), one of the new data sets in the input buffer that exhibits the highest quality is selected (block 425). The highest quality is the data set that corresponds to the detect quality metric with the lowest value. In some cases, only one previously unprocessed or new data set is available in the input buffer. In such cases, the only available data set is selected. The selected data set is accessed from the input buffer (block 430) and a data detection algorithm is applied to the newly received data set (i.e., the first global iteration of the data set) without guidance of a previously decoded output (block 435). In some cases, the data detection algorithm is a Viterbi algorithm data detector circuit or a maximum a posteriori data detector circuit. Application of the data detection algorithm yields a detected output. A derivative of the detected output is stored to the central memory (block 440). The derivative of the detected output may be, for example, an interleaved or shuffled version of the detected output.

Where a new normal data set is not available (block 418) and a retry data set is available (block 419), one of the available retry data sets is selected from the input buffer (block 480) and accessed from the input buffer as a retry data set (block 485). A data detection algorithm is applied to the retry data set in accordance with retry processing rules to yield a detected output (block 490). The retry processing rules may be different from standard data detection and include, but not be limited to, using a previously failed identification of unsatisfied checks or a previously available decode output to guide processing. One of ordinary skill in the art will recognize a variety of modifications of a standard data detection processing that may be applied to a data set that failed to converge during such standard processing. A derivative of the detected output is stored to the central memory (block 440). The derivative of the detected output may be, for example, an interleaved or shuffled version of the detected output. Otherwise, where a retry data set is not available (block 419), the processing returns to block 405 and the data detector circuit is idled.

Figure 4B:
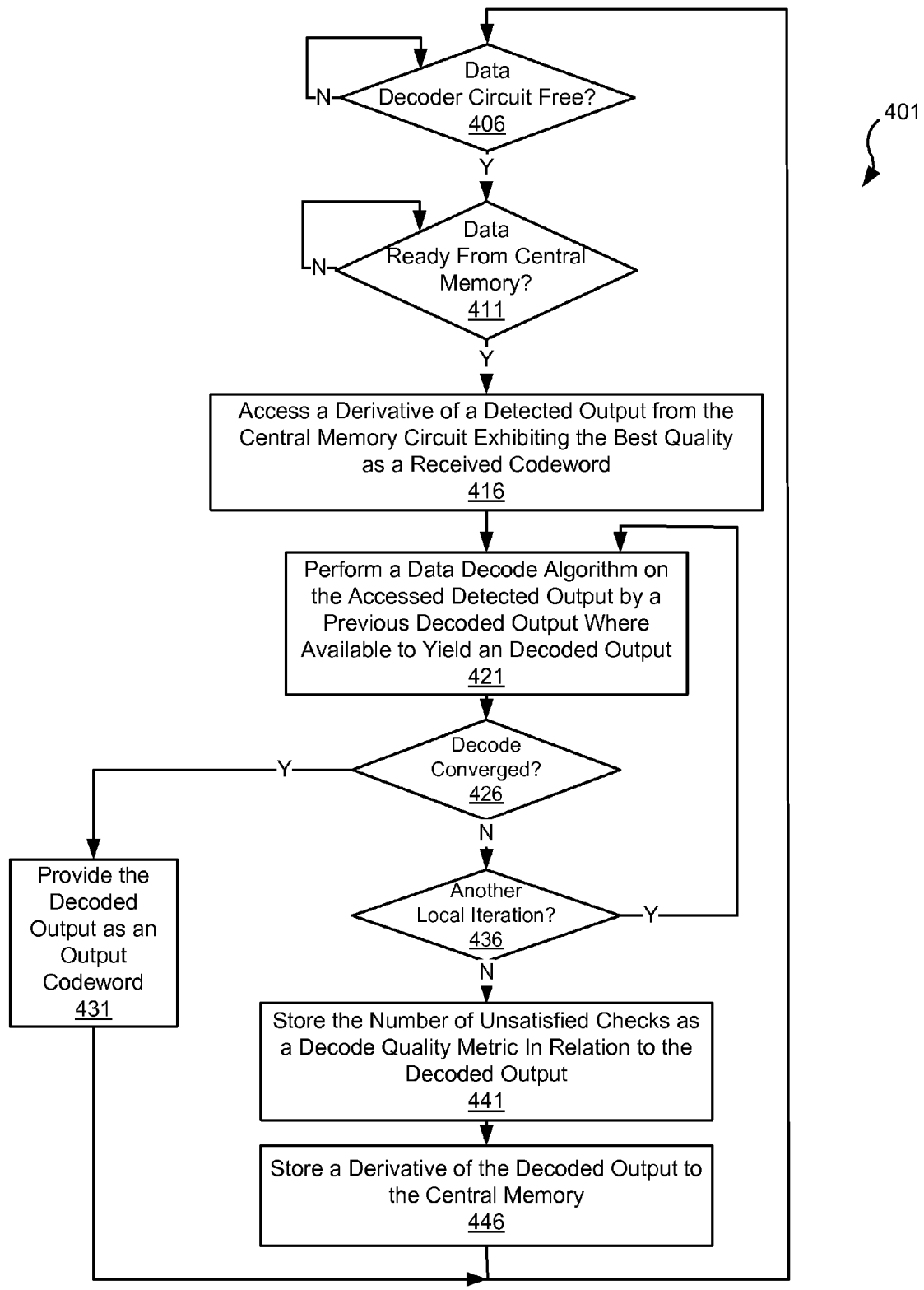

Turning to FIG. 4b, a flow diagram 401 shows a counterpart of the method described above in relation to FIG. 4a. Following flow diagram 401, in parallel to the previously described data detection process of FIG. 4a, it is determined whether a data decoder circuit is available (block 406). The data decoder circuit may be, for example, a low density data decoder circuit as are known in the art. Where the data decoder circuit is available (block 406), it is determined whether a derivative of a detected output is available for processing in the central memory (block 411). Where such a data set is ready (block 411), the previously stored derivative of a detected output that exhibits the best quality is accessed from the central memory and used as a received codeword (block 416). The best quality is based on a decode quality metric for detected outputs on their second or later global iteration, or on a detect quality metric for detected outputs on their first global iteration. A data decode algorithm is applied to the received codeword to yield a decoded output (block 421). Where a previous local iteration has been performed on the received codeword, the results of the previous local iteration (i.e., a previous decoded output) are used to guide application of the decode algorithm. It is then determined whether the decoded output converged (i.e., resulted in the originally written data) (block 426). Where the decoded output converged (block 426), it is provided as an output codeword (block 431). Alternatively, where the decoded output failed to converge (block 426), it is determined whether another local iteration is desired (block 436). In some cases, four local iterations are allowed per each global iteration. Based upon the disclosure provided herein, one of ordinary skill in the art will recognize another number of local iterations that may be used in relation to different embodiments of the present invention. Where another local iteration is desired (block 436), the processes of blocks 406-436 are repeated for the codeword. Alternatively, where another local iteration is not desired (block 436), the number of unsatisfied checks are stored as the decode quality metric in relation to the decoded output (block 441), and a derivative of the decoded output is stored to the central memory (block 446). The derivative of the decoded output being stored to the central memory triggers the data set ready query of block 405 to begin the data detection process.

In some embodiments of the present invention during the aforementioned data decoding and data detection processing described above in relation to FIG. 4*a*, the clock provided to one or both of the data detection circuit or the data decoding circuit is generated in accordance with the method described in a flow diagram 451 of FIG. 4*b*. Following flow diagram 451, it is determined whether the data decoding circuit is operational (block 450). The data decoding circuit is considered operational when it is actively applying a data decode algorithm to a data set. Where the data decoding circuit is operational (block 450), it is determined whether the data detector circuit is operational (block 455). The data detector circuit is considered operational when it is actively applying a data decode algorithm to a data set. Where it is determined that the data detector circuit is operational (block 455) a clock count is incremented (block 460). The clock count modulus N is then determined, and where the clock count modulus N is equal to zero (block 465), the current cycle of one or both of a clock synchronizing operation of the data detector circuit and/or a clock synchronizing operation of the data decoding circuit is deleted or suppressed (block 470).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for priority based data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
 a data detector circuit operable to apply a data detection algorithm to a detector input to yield a detected output;
 a data decoder circuit operable to apply a data decode algorithm to a decoder input derived from the detected output to yield a decoded output;
 an input buffer operable to maintain at least a first data set and a second data set, wherein the first data set completed a limited amount of processing by the data detector circuit and the decoder circuit without converging, and wherein the second data set is yet to complete the limited amount of processing by the data detector circuit and the decoder circuit; and
 a scheduling circuit operable to schedule processing of the first data set by one of the data detector circuit and the data decoder circuit in parallel with processing of the second data set by one of the data detector circuit and the data decoder circuit.

2. The data processing system of claim 1, wherein the input buffer is further operable to store a third data set yet to complete the limited amount of processing by the data detector circuit and the decoder circuit, and wherein the scheduling circuit is further operable to select between the second data set and the third data set for introduction to the data detector circuit as the detector input based at least in part on a priority scheme.

3. The data processing system of claim 2, wherein the priority scheme allows for selecting one of the second data set or the third data set out of order from when it was originally stored in the input buffer.

4. The data processing system of claim 2, wherein the data processing system further comprises:
 a quality metric determination circuit operable to determine a first quality metric based upon the second data set and to determine a second quality metric based upon the third data set.

5. The data processing system of claim 4, wherein the first quality metric is based upon a result selected from: an output from a detection process, and the decoded output.

6. The data processing system of claim 4, wherein the priority scheme is based at least in part on comparison of a first quality metric associated with the second data set and a second quality metric associated with the third data set.

7. The data processing system of claim 2, wherein the priority scheme allows for introduction of the first data set as the detector input only after selection of the second data set and the third data set.

8. The data processing system of claim 1, wherein the data detector circuit is selected from a group consisting of: a Viterbi algorithm data detector circuit, and a maximum a posteriori data detector circuit.

9. The data processing system of claim 1, wherein the data decoder circuit is a low density parity check decoder circuit.

10. The data processing system of claim 1, wherein the system is implemented as an integrated circuit.

11. The data processing system of claim 1, wherein the data processing system is incorporated in a device selected from a group consisting of: a storage device, and a data transmission device.

12. A method for data processing, the method comprising:
 providing a data processing circuit including:
  a data detector circuit operable to apply a data detection algorithm to a detector input to yield a detected output;
  a data decoder circuit operable to apply a data decode algorithm to a decoder input derived from the detected output to yield a decoded output;
 storing a first data set to an input buffer, wherein the first data set completed a limited amount of processing by the data detector circuit and the decoder circuit without converging;
 storing a second data set to the input buffer, wherein the second data set is yet to complete the limited amount of processing by the data detector circuit and the decoder circuit; and
 scheduling processing of the first data set by one of the data detector circuit and the data decoder circuit in parallel with processing of the second data set by one of the data detector circuit and the data decoder circuit.

13. The method of claim 12, wherein the method further comprises:
    storing a third data set to the input buffer, wherein the third data set is yet to complete the limited amount of processing by the data detector circuit and the decoder circuit; and
    selecting one of the second data set and the third data set for introduction to the data detector circuit as the detector input based at least in part on a priority scheme.

14. The method of claim 13, wherein the priority scheme allows for selecting one of the second data set or the third data set out of order from when it was originally stored in the input buffer.

15. The method of claim 13, wherein the method further comprises:
    determining a first quality metric based upon the second data set and to determine a second quality metric based upon the third data set.

16. The method of claim 15, wherein the first quality metric is based upon a result selected from: an output from a detection process, and the decoded output.

17. The method of claim 15, wherein the priority scheme is based at least in part on comparison of a first quality metric associated with the second data set and a second quality metric associated with the third data set.

18. A storage device, the storage device comprising:
    a storage medium;
    a head assembly disposed in relation to the storage medium and operable to provide a sensed signal corresponding to information on the storage medium;
    a read channel circuit including:
    an analog to digital converter circuit operable to sample an analog signal derived from the sensed signal to yield a series of digital samples;
    an equalizer circuit operable to equalize the digital samples to yield a first data set and a second data set;
    a data detector circuit operable to apply a data detection algorithm to a selected data set to yield a detected output;
    a data decoder circuit operable to apply a data decode algorithm to a decoder input derived from the detected output to yield a decoded output;
    an input buffer operable to maintain at least the first data set and the second data set, wherein the first data set completed a limited amount of processing by the data detector circuit and the decoder circuit without converging, and wherein the second data set is yet to complete the limited amount of processing by the data detector circuit and the decoder circuit; and
    a scheduling circuit operable to schedule processing of the first data set by one of the data detector circuit and the data decoder circuit in parallel with processing of the second data set by one of the data detector circuit and the data decoder circuit.

19. The storage device of claim 18, wherein the storage medium includes a magnetic storage medium, and wherein the storage device further comprises:
    a solid state storage medium.

20. The storage device of claim 18, wherein the input buffer is further operable to store a third data set yet to complete the limited amount of processing by the data detector circuit and the decoder circuit, and wherein the scheduling circuit is further operable to select between the second data set and the third data set for introduction to the data detector circuit as the detector input based at least in part on a priority scheme.

* * * * *